(12) United States Patent
Minzoni et al.

(10) Patent No.: US 7,046,060 B1
(45) Date of Patent: May 16, 2006

(54) METHOD AND APPARATUS COMPENSATING FOR FREQUENCY DRIFT IN A DELAY LOCKED LOOP

(75) Inventors: Alessandro Minzoni, Morrisville, NC (US); Jung Pill Kim, Cary, NC (US)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 10/973,389

(22) Filed: Oct. 27, 2004

(51) Int. Cl.
*H03L 7/18* (2006.01)

(52) U.S. Cl. .................. 327/158; 327/160; 327/161

(58) Field of Classification Search ............... None
See application file for complete search history.

(56) References Cited

U.S. PATENT DOCUMENTS

| | | | |
|---|---|---|---|
| 5,955,904 A * | 9/1999 | Kawasaki | 327/156 |
| 6,066,969 A | 5/2000 | Kawasaki et al. | |
| 6,181,174 B1 | 1/2001 | Fujieda et al. | |
| 6,242,954 B1 | 6/2001 | Taniguchi et al. | |
| 6,327,318 B1 * | 12/2001 | Bhullar et al. | 375/374 |
| 6,434,062 B1 | 8/2002 | Lee | |
| 6,501,309 B1 * | 12/2002 | Tomita | 327/158 |
| 6,653,875 B1 | 11/2003 | Partsch et al. | |
| 6,683,928 B1 | 1/2004 | Bhullar et al. | |
| 6,759,911 B1 | 7/2004 | Gomm et al. | |
| 6,791,381 B1 | 9/2004 | Stubbs et al. | |
| 6,794,913 B1 | 9/2004 | Stengel | |
| 2004/0150444 A1 | 8/2004 | Park | |

OTHER PUBLICATIONS

Kirk, B.; "Clock Management with PLLs and DLLs"; retrieved from Internet; Mar. 28, 2001; http://www.eedesign.com/article/showArticle.jhml?articleId=16502784; 7 pages.

* cited by examiner

*Primary Examiner*—Timothy P. Callahan
*Assistant Examiner*—An T. Luu
(74) *Attorney, Agent, or Firm*—Edell, Shapiro, Finnan LLC

(57) ABSTRACT

A delay locked loop (DLL) according to the present invention includes a cycle time detector to determine the quantity of delay elements within a clock cycle and adjust a DLL counter controlling a DLL variable delay line to enable operation or locking in response to DLL overflow and underflow conditions. The cycle time detector includes a ring oscillator having a strong correlation between the oscillator period and the DLL delay elements. The output of the oscillator controls the counter to provide a new locking position for the DLL in the presence of overflow or underflow conditions. The oscillator is driven for an interval corresponding to the product of the external clock period and the quantity of delay elements in the ring oscillator. In effect, the delay of the DLL is adjusted to the preceding or succeeding external clock period to enable locking in response to overflow or underflow conditions.

40 Claims, 6 Drawing Sheets

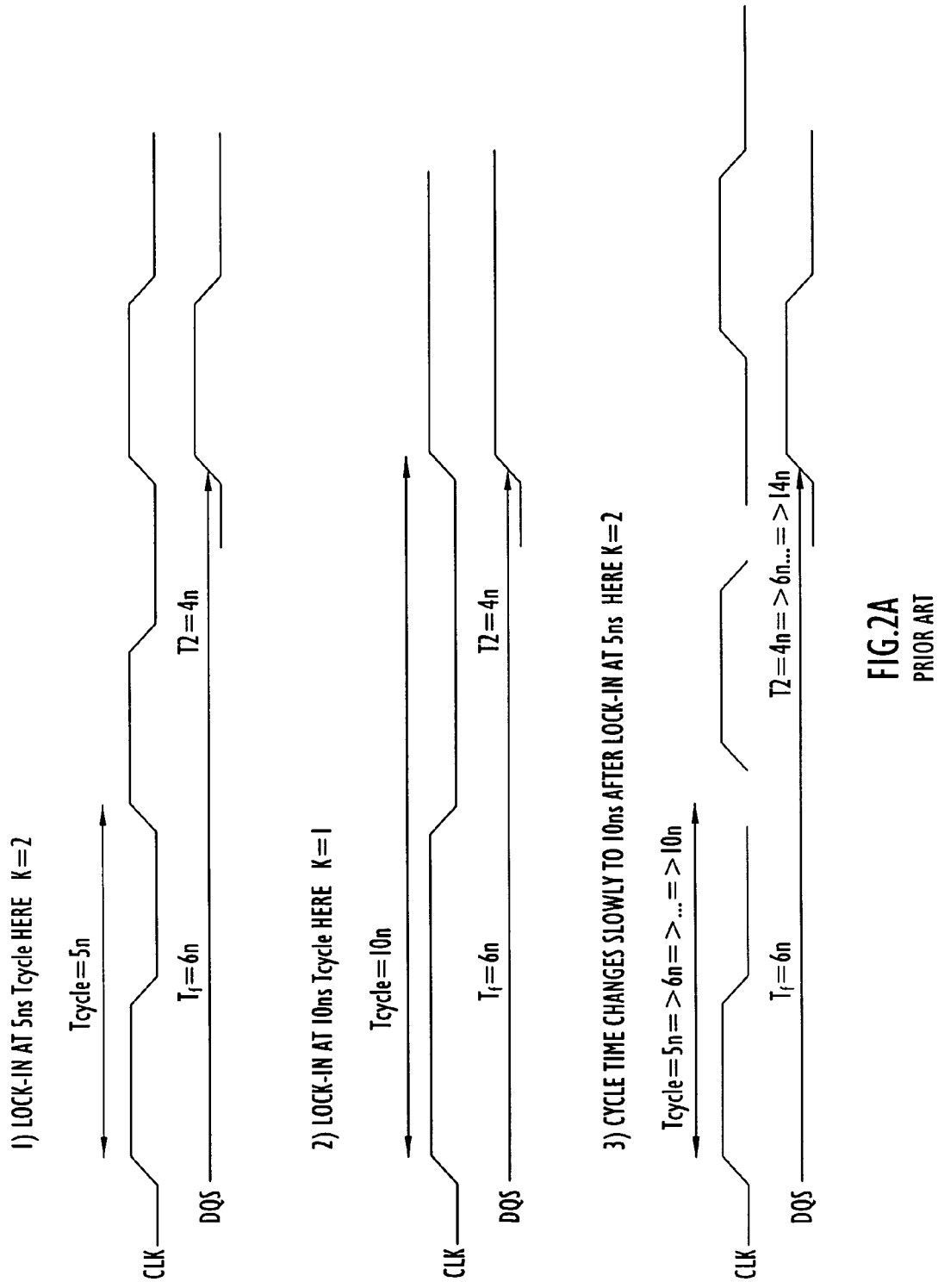

METHOD AND APPARATUS COMPENSATING FOR FREQUENCY DRIFT IN A DELAY LOCKED LOOP

BACKGROUND OF THE INVENTION

1. Technical Field

The present invention pertains to synchronization of signals. In particular, the present invention pertains to a delay locked loop circuit that produces a signal synchronized to an externally supplied signal and compensates for frequency drift in that external signal.

2. Discussion of the Related Art

Generally, a delay locked loop circuit (DLL) reduces or compensates for a skew between a clock signal and data or between an external clock and an internal clock. For example, the delay locked loop may be used to synchronize an internal clock of a synchronous memory to an external clock without incurring any error. Typically, a timing delay occurs when a clock provided externally is used within the apparatus. The delay locked loop controls the timing delay to synchronize the internal clock to the external clock.

A conventional DLL is illustrated in FIG. 1. Specifically, DLL 10 includes an input receiver 15, a variable delay line 20, an off-chip driver 30, a phase detector 40, a counter 50 and a feedback circuit 60. The input receiver receives an external clock signal (CLK) and produces an internal clock signal (CLK2DLL) for transference to variable delay line 20 and phase detector 40. The internal clock signal includes an initial delay (T1) corresponding to the delay or amount of processing time utilized by the input receiver. The variable delay line delays the internal clock signal by an amount (T2) corresponding to a phase difference between the internal clock (CLK2DLL) and feedback (FBCLK) signals as described below. The resulting signal from the variable delay line (DCLK) is transferred to off-chip driver 30 and to feedback circuit 60. The driver further delays the signal by a delay or amount of processing time (δr) utilized by the driver and provides a clock signal (DQS) synchronized with the external clock signal (CLK) to other circuits.

The feedback circuit receives the signal (DCLK) from the variable delay line and includes delay elements producing a delay (Tf) corresponding to the delays of the input receiver (T1) and the driver (δr). Thus, the resulting feedback signal (FBCLK) produced by the feedback circuit simulates the delays (Tf=T1+δr) encountered by the external clock signal (CLK). The feedback signal (FBCLK) and internal clock signal (CLK2DLL) are received by phase detector 40 that determines the phase difference or skew between these signals, thereby indicating the phase difference between the internal and external clock signals (CLK and DQS).

The phase detector controls counter 50 to indicate the phase difference between the internal clock and feedback signals. The phase detector generally increments or decrements the counter to enable the count to indicate the phase difference. The count basically represents the phase difference in terms of a quantity of delay elements or units of the variable delay line. The counter controls the delay provided by variable delay line 20 to compensate for the phase difference between the signals (CLK2DLL and FBCLK) and enable the resulting signal (DQS) to become synchronized with the external clock signal (CLK). In other words, the DLL determines the delay (T2) of the variable delay line to align the resulting signal from the driver (DQS) with the external clock signal (CLK). The delay of the delay line (T2) may be expressed as follows:

$$T2 = K*Tcycle - Tf,$$

where $K*Tcycle$ is an integer multiple of the external clock signal period. The various DLL signals and corresponding skews are illustrated in the timing diagrams of FIG. 1.

The DLL typically operates over a clock frequency range to lock onto a particular clock or operational frequency. By way of example only, the DLL may operate in the frequency range of 80 MHz–600 MHz (or clock cycles (Tcycle) in the range of approximately 1.6 to 12.5 nanoseconds). In this case, counter 50 includes a value between zero and $2^P-1$, where P represents the quantity of bits utilized for the count. Once the DLL is locked onto or reset for a clock frequency, systems may change the operating or clock frequency for power saving or other purposes without resetting the DLL. The DLL operates under the lock condition parameters until the counter reaches a minimum or maximum value. At this point, the delay within the DLL is likely to become insufficient to align the clock signals (CLK and DQS), where the resulting clock signal (DQS) does not become synchronized with the external signal (CLK).

Basically, two situations may arise in response to the frequency change. One situation is referred to as "overflow" and the other situation is referred to as "underflow". Overflow occurs when a maximum delay of the DLL is reached (e.g., the counter reaches a maximum count value or a value of $2^P-1$). A further decrease in the clock frequency (or increase in the clock period) will require a delay which the DLL cannot accommodate (e.g., the delay required will be beyond the maximum delay of the DLL). The overflow condition is illustrated, by way of example only, in FIG. 2A. The first time line graphically illustrates the external clock signal (CLK) with the DLL locked to a clock period or Tcycle of five nanoseconds. The resulting signal (DQS) is delayed by a feedback circuit delay (Tf) of six nanoseconds, thereby providing a variable delay line delay (T2) of four nanoseconds (e.g., T2=K*Tcycle-Tf as described above, where the lock occurs at K=2) to align the external clock and resulting signals (CLK and DQS). The second time line graphically illustrates the external clock signal (CLK) with the DLL locked to a clock period or Tcycle of ten nanoseconds. The resulting signal (DQS) is delayed by the feedback circuit delay (Tf) of six nanoseconds, thereby providing a variable delay line delay (T2) of four nanoseconds (e.g., T2=K*Tcycle-Tf as described above, where the lock occurs at K=1) to align the external clock and resulting signals (CLK and DQS). The third time line graphically illustrates the change in period (Tcycle) of the external clock signal (CLK) from five nanoseconds to ten nanoseconds with the DLL locked to a clock period or Tcycle of five nanoseconds and K=2 (e.g., as in the first time line). The resulting signal (DQS) is delayed by the feedback circuit delay (Tf) of six nanoseconds, thereby providing a variable delay line delay (T2) of fourteen nanoseconds (e.g., T2=K*Tcycle-Tf as described above, where the lock occurs at K=2) to align the external clock and resulting signals (CLK and DQS). Since the maximum delay of the variable delay line is on the order of a maximum Tcycle (or twelve nanoseconds for 80 MHz as described above), the delay needed to synchronize the external clock and resulting signals (CLK and DQS) is beyond the capability of the DLL.

The second situation or underflow occurs when the delay (T2) needed for the DLL to lock is zero (e.g., the counter reaches a count value of zero). A further increase in clock frequency (or decrease in clock period) will require a negative delay which is not possible. The underflow condition is illustrated, by way of example only, in FIG. 2B. The first time line graphically illustrates the external clock signal (CLK) with the DLL locked to a clock period or Tcycle of five nanoseconds. The resulting signal (DQS) is delayed by a feedback circuit delay (Tf) of six nanoseconds, thereby providing a variable delay line delay (T2) of four nanoseconds (e.g., T2=K*Tcycle−Tf as described above, where the lock occurs at K=2) to align the external clock and resulting signals (CLK and DQS). The second time line graphically illustrates the external clock signal (CLK) with the DLL locked to a clock period or Tcycle of ten nanoseconds. The resulting signal (DQS) is delayed by the feedback circuit delay (Tf) of six nanoseconds, thereby providing a variable delay line delay (T2) of four nanoseconds (e.g., T2=K*Tcycle−Tf as described above, where the lock occurs at K=1) to align the external clock and resulting signals (CLK and DQS). The third time line graphically illustrates the change in period (Tcycle) of the external clock signal (CLK) from ten nanoseconds to five nanoseconds with the DLL locked to a clock period or Tcycle of ten nanoseconds and K=1 (e.g., as in the second time line). The resulting signal (DQS) is delayed by the feedback circuit delay (Tf) of six nanoseconds, thereby providing a negative variable delay line delay (T2) of one nanosecond (e.g., T2=K*Tcycle−Tf as described above, where the lock occurs at K=1) to align the external clock and resulting signals (CLK and DQS). Since the minimum delay of the variable delay line is zero or no delay, the negative delay needed to synchronize the external clock and resulting signals (CLK and DQS) is beyond the capability of the DLL.

A proposed solution is to utilize additional delay lines. For example, two lines may be used for the external and feedback clock signals (CLK and FBCLK), while a third delay line may be utilized as a reference for the DLL. In response to an overflow or underflow condition, the DLL is automatically reset to lock onto a new clock frequency. The reset may be applied with or without the additional delay lines to accommodate the underflow or overflow condition. Another proposed solution is to increase the amount of the delay in the delay line.

However, the proposed solutions suffer from several disadvantages. In particular, the use of additional delay or delay lines reduces the area on integrated circuits or chips, and increases jitter, power or current consumption and complexity of the circuit. Further, the use of a DLL reset produces a locking period that prevents use of the DLL during that period (e.g., the output of the DLL may not be used for a period on the order of a few hundred clock cycles).

The present invention accommodates the overflow and underflow conditions with the proper amount of delay (e.g., on the order of the maximum clock period or Tcycle) in the DLL. When the DLL reaches an overflow or underflow condition, the DLL is still presumably locked since the frequency drift is slow relative to the update rate of the DLL, where the latency of the locked loop is represented by K. In the case of an overflow condition, the next locking position is typically within the preceding clock period (e.g., K−1), while the next locking position for an underflow condition is typically within the succeeding clock period (e.g., K+1). The present invention decrements the DLL counter in response to an overflow condition by the number of coarse delay elements within a clock period to enable locking within the preceding clock period. Similarly, the present invention increments the DLL counter in response to an underflow condition by the number of coarse delay elements within a clock period to enable locking within the succeeding clock period.

SUMMARY OF THE INVENTION

According to the present invention, a DLL includes a cycle time detector to determine the quantity of delay elements within a clock cycle and adjust a DLL counter controlling a variable delay line to enable DLL operation or locking in response to DLL overflow and underflow conditions. The cycle time detector includes a ring oscillator having a known relation and strong correlation between the oscillator period and the delay elements of the DLL. The output of the oscillator controls the DLL counter to provide a new locking position for the DLL in the presence of overflow or underflow conditions. The oscillator is driven for an interval corresponding to the product of the external clock period and the quantity of delay elements in the ring oscillator. In effect, the delay of the DLL is adjusted to the preceding or succeeding external clock period to enable locking in response to overflow or underflow conditions.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

BRIEF DESCRIPTION OF THE DRAWINGS

FIG. 2A is a graphical illustration of DLL timing diagrams for a DLL overflow condition.

DETAILED DESCRIPTION OF THE PREFERRED EMBODIMENTS

Figure 1:
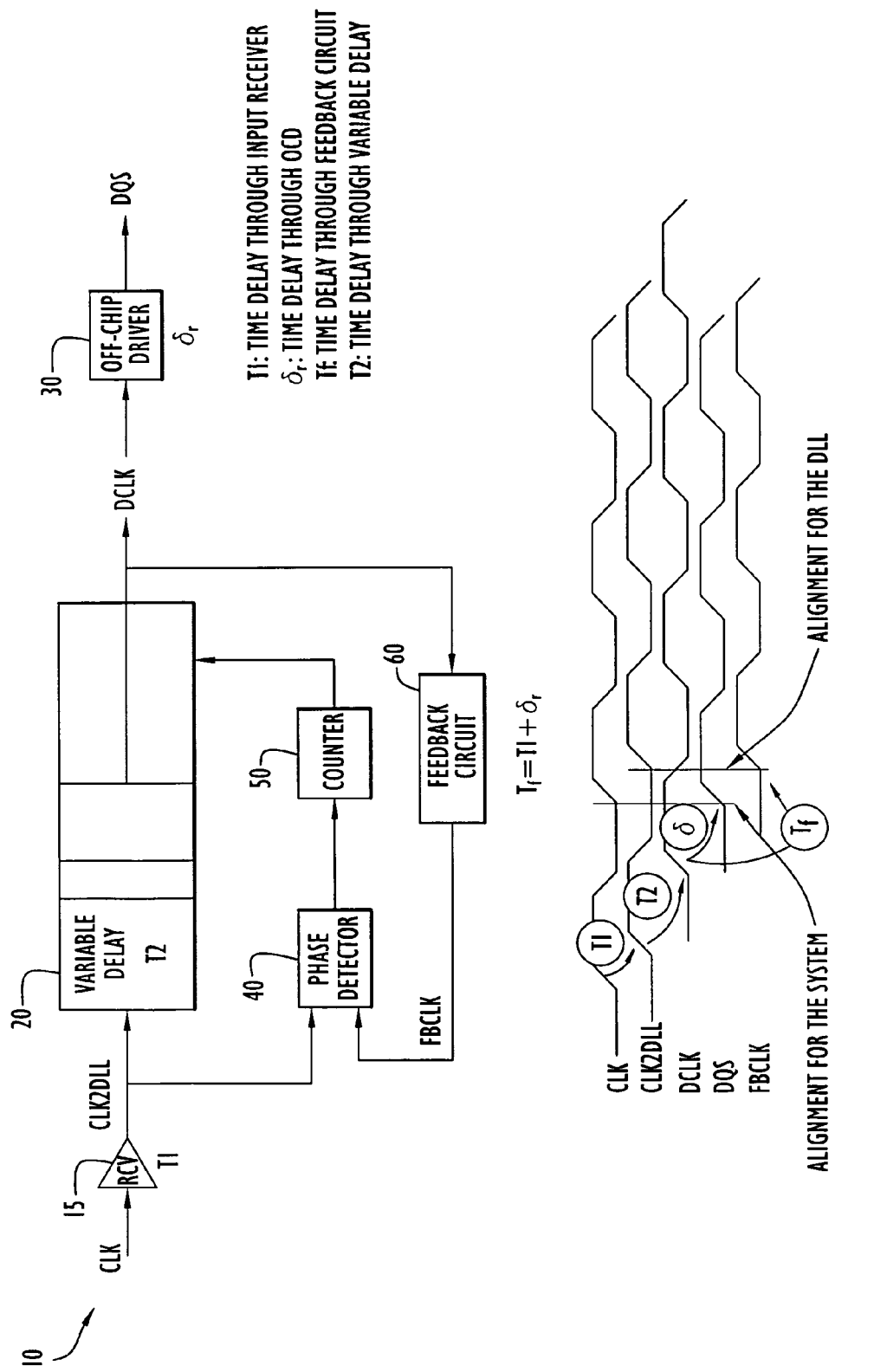
FIG. 1 is a schematic block diagram of a conventional delay locked loop circuit (DLL).
Figure 2B:
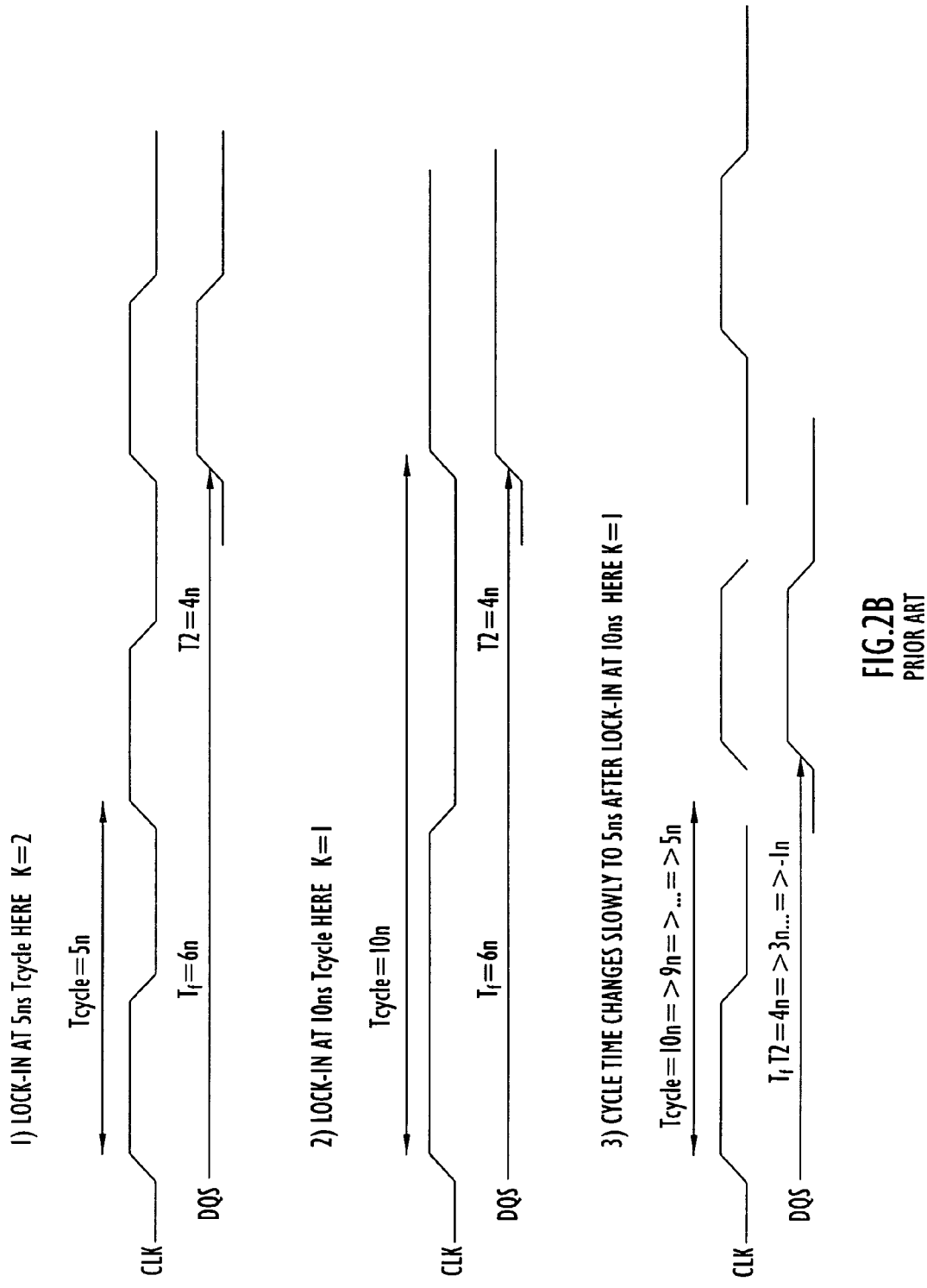
FIG. 2B is a graphical illustration of DLL timing diagrams for a DLL underflow condition.
Figure 3:
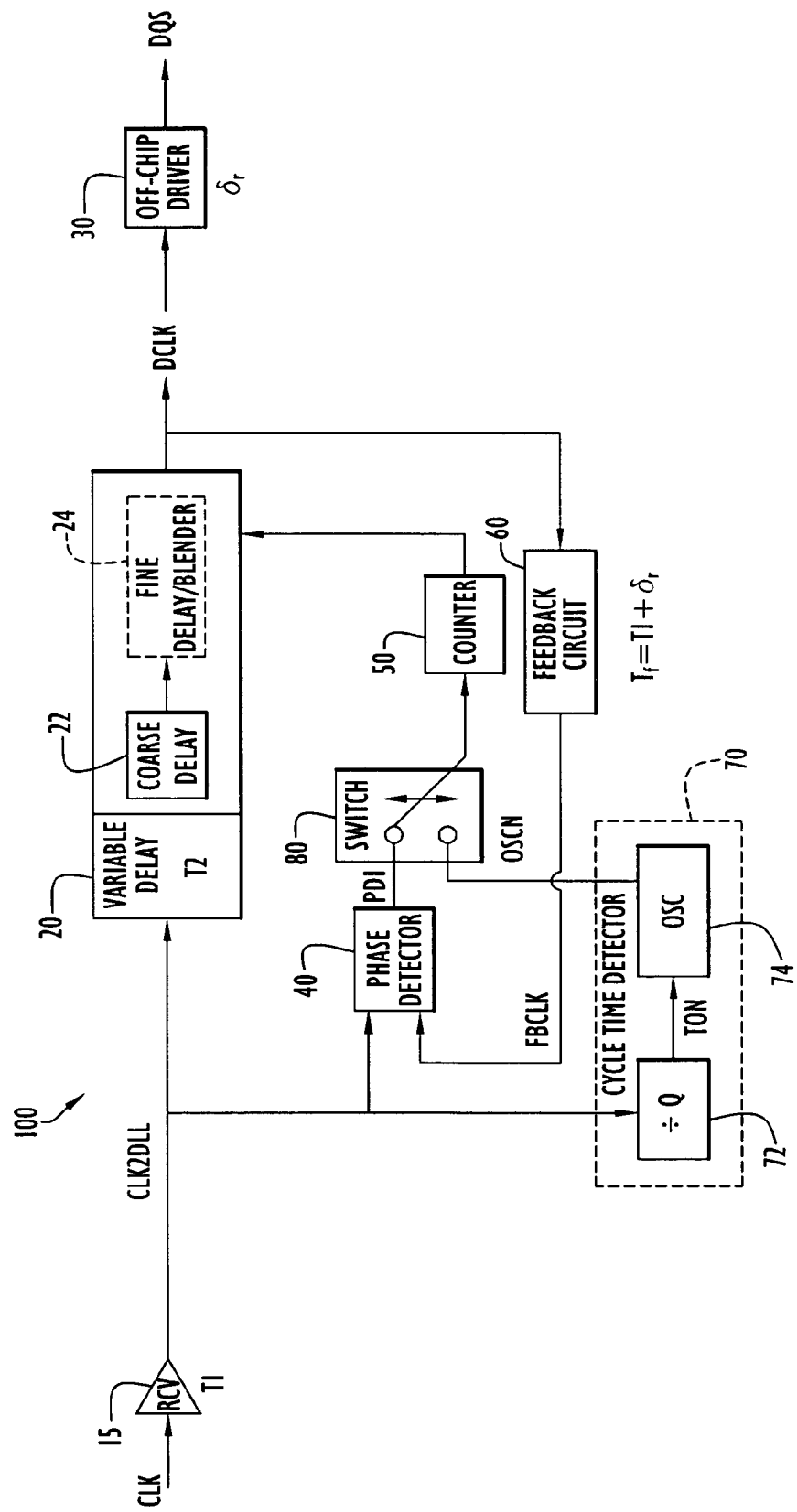
FIG. 3 is a schematic block diagram of a delay locked loop circuit (DLL) according to the present invention.
Figure 4:
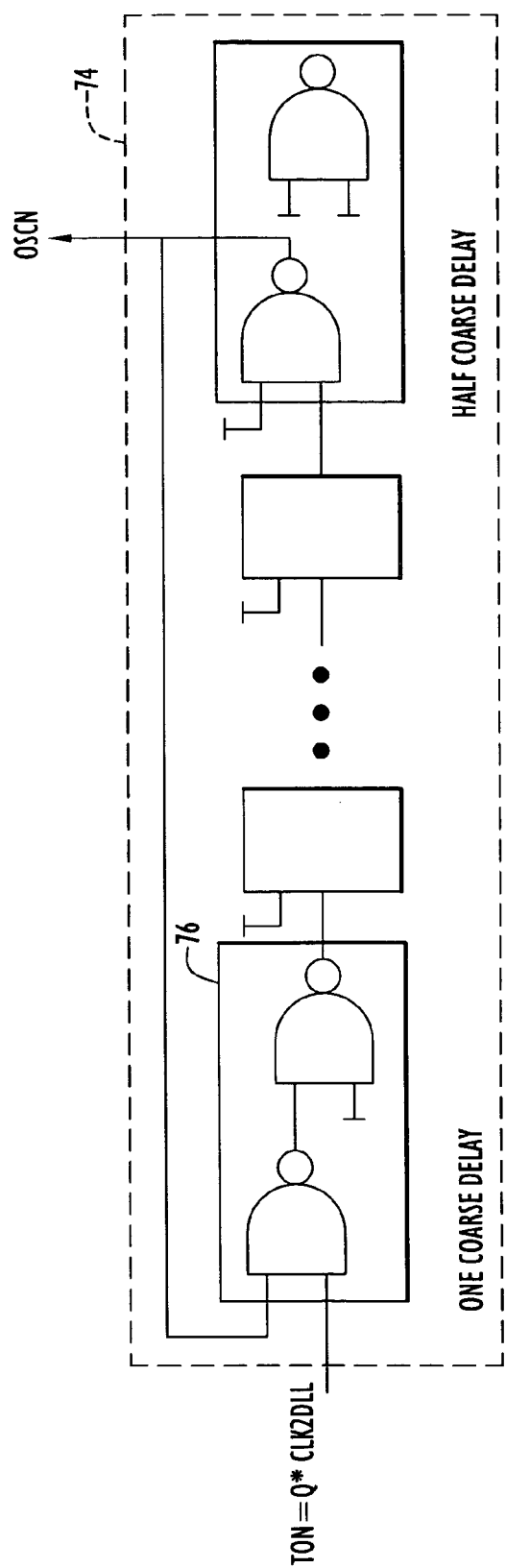
FIG. 4 is a schematic diagram of a ring oscillator of the cycle time detector of the DLL of FIG. 3.

A delay locked loop circuit (DLL) reduces or compensates for a skew between a clock signal and data or between an external clock and an internal clock as described above. However, these types of circuits may encounter overflow or underflow conditions during periods of clock frequency drift that require delays beyond the capability of the DLL, thereby preventing synchronization of the signals as described above. Accordingly, the present invention DLL accommodates overflow and overflow conditions without the adverse effects of adding additional delay or delay elements or resetting the DLL for operation. A DLL according to the present invention is illustrated in FIGS. 3–4. The DLL typically operates over a clock frequency range to lock onto a particular clock or operational frequency as described below. By way of example only, the DLL may operate in the frequency range of 80 MHz–600 MHz (or clock cycles (Tcycle) in the range of approximately 1.6 to 12.5 nanoseconds); however, the DLL may accommodate any desired frequency range. Specifically, DLL 100 includes input receiver 15, variable delay line 20, off-chip driver 30, phase detector 40, counter 50 and feedback circuit 60, each substantially similar to those described above. These components may be implemented by any conventional or other devices or circuitry (e.g., logic, processors, software and/or hardware modules, gates, integrated circuits, etc.) performing the functions described below. Briefly, the input receiver receives the external clock signal (CLK) and produces an internal clock signal (CLK2DLL) for transference to variable delay line 20 and phase detector 40. The internal clock signal includes an initial delay (T1) corresponding to the delay or amount of processing time utilized by the input receiver. The input receiver is generally in the form of a buffer or other device to receive the signal.

Variable delay line 20 delays the internal clock signal by an amount (T2) corresponding to a phase difference between the internal and feedback clock signals as described above. The delay line includes a coarse delay line or unit 22 that provides a delay in stages or increments based on the value in the counter. The coarse delay unit typically includes a plurality of controllable delay elements (e.g., buffers, logic gates, etc.) each providing a known delay to the signal. For example, delay line 20 may provide a maximum delay of twelve nanoseconds (e.g., corresponding to a maximum Tcycle for 80 MHz) with each coarse delay element providing the delay in increments of 300 picoseconds. In order to provide delays with resolution beyond the coarse delay element (e.g., 300 picoseconds), delay line 20 may further include a fine delay line or blender unit 24. The blender unit is disposed in series with the coarse delay unit and typically includes a plurality of controllable delay elements (e.g., buffers, logic gates, etc.) each providing a further known delay to the signal. By way of example, blender unit 24 may provide a maximum additional delay of 300 picoseconds, thereby enhancing resolution by providing delays within the delay increments of the coarse delay units. In other words, the blender unit provides delays corresponding to a portion of a coarse delay unit (e.g., to provide a delay that is not an integer multiple of a coarse delay). The blender unit may compensate for errors within the DLL and is typically driven by the least significant bits of the counter as described below. The resulting signal from the variable delay line (DCLK) is transferred to off-chip driver 30 and to feedback circuit 60. The driver further delays the signal by a delay or amount of processing time (δr) utilized by the driver and provides a clock signal (DQS) synchronized with the external clock signal (CLK) to other circuits.

The feedback circuit receives the signal (DCLK) from the variable delay line and includes delay elements producing a delay (Tf) corresponding to the delays of the input receiver (T1) and the driver (δr). The delay elements may be implemented by any conventional or other devices (e.g., buffers, logic gates, etc.). Thus, the resulting feedback signal produced by the feedback circuit (FBCLK) simulates the delays (e.g., Tf=T1+δr) encountered by the external clock signal (CLK). The feedback signal (FBCLK) and internal clock signal (CLK2DLL) are received by phase detector 40 that determines the phase difference or skew between these signals, thereby indicating the phase difference between the external and resulting clock signals (CLK and DQS).

The phase detector is coupled to a switch 80 that detects overflow and underflow conditions and provides controls to counter 50 in accordance with detected conditions as described below. Switch 80 may be implemented by any conventional or other switching device (e.g., transfer gate, logic, processor, software and/or hardware modules, integrated circuit, etc.). During the normal operating mode (e.g., in the absence of overflow or underflow conditions), switch 80 couples the phase detector output (PD1) to counter 50 to indicate the phase difference between the signals received by the phase detector (CLK2DLL and FBCLK). The phase detector generally increments or decrements the counter to enable the count to indicate the phase difference. The count basically represents the phase difference in terms of a quantity of delay elements or units of the variable delay line. The counter controls the delay (T2) provided by variable delay line 20 to compensate for the phase difference between the signals (CLK2DLL and FBCLK) and enable the resulting signal (DQS) to become synchronized with the external clock signal (CLK) as described above (e.g., T2=K*Tcycle−Tf, where K*Tcycle is an integer multiple of the clock signal period).

The DLL typically operates to lock onto a particular clock or operational frequency. In this case, counter 50 includes a value between zero and $2^P-1$, where P represents the quantity of bits utilized for the count as described above. By way of example only, the counter is implemented by a nine bit counter with the six most significant bits used to control coarse delay unit 22 and the three least significant bits used to control blender unit 24. Once the DLL is locked onto a clock frequency, systems may change the operating or clock frequency for power saving or other purposes without resetting the DLL. The DLL operates under the lock condition parameters during the frequency drift until a frequency is attained that causes the counter to reach a maximum or minimum value, thereby respectively indicating overflow and underflow conditions as described above. These conditions basically indicate the delays to synchronize the external clock and resulting signals (CLK and DQS) that are beyond the delay provided by the variable delay line as described above.

In order to accommodate overflow and underflow conditions, DLL 100 further includes a cycle time detector 70. Specifically, when the DLL reaches an overflow or underflow condition, the DLL is still presumably locked (e.g., at the frequency causing the counter to reach the maximum or minimum value), where the latency of the locked loop is represented by K. In the case of an overflow condition, the next locking position is typically within the preceding clock period (e.g., K−1), while the next locking position for an underflow condition is typically within the succeeding clock period (e.g., K+1). The cycle time detector is enabled in response to an overflow or underflow condition and determines the quantity of coarse delay elements within a clock period. The output of the cycle time detector (OSCN) is coupled to switch 80 that enables the cycle time detector to control counter 50 during overflow and underflow conditions. The switch is coupled to counter 50 and determines the presence of overflow and underflow conditions based on the count value (e.g., an overflow condition occurs in response to the counter attaining a maximum count value ($2^P-1$), whereas an underflow condition occurs in response to the counter attaining a zero count value). The cycle time detector adjusts the count within the counter by the number of coarse delay elements within a clock period to enable locking within the preceding or succeeding clock period in accordance with detected overflow and underflow conditions, respectively. In other words, the cycle time detector determines (K−1)*Tcycle or (K+1)*Tcycle, where K is the first integer that satisfies the locking condition (e.g., T2=K*Tcycle−Tf). Once overflow or underflow is detected, the cycle time detector changes the count value or DLL delay (T2) to a lock position that may be expressed as:

$T2=(K-1)*Tcycle-Tf$ (overflow) or $T2=(K+1)*Tcycle-Tf$ (underflow).

The count value provided to the delay line is maintained at the minimum or maximum value in response to underflow or overflow conditions to enable the count value to be adjusted without affecting the delay.

Cycle time detector 70 includes a frequency divider module 72 and a ring oscillator 74. The period of the ring oscillator is strongly correlated with the DLL delay to enable determination of the quantity of delay elements within a clock period. The oscillator includes a plurality of delay elements 76 (FIG. 4) arranged in a chain or a cascaded fashion. Each delay element includes a pair of NAND type logic gates to provide a coarse delay, Tcoarse, for that delay element. The final delay element in the chain utilizes a single NAND gate or one half of a coarse delay to provide an inverted resulting signal (e.g., since two NAND gates within each prior delay element provide a non-inverted signal). This inverted signal is fed back to the initial delay element, thereby enabling the oscillator to generate an alternating signal to form a clock type output.

The oscillator includes a quantity, M, of delay elements 76 and an additional one half of a delay element 76, thereby providing a total of M+½ delay elements. The quantity of coarse delays or delay elements 76 within ring oscillator 74 is selected based on the capability of counter 50. The lesser the quantity of delay elements, the faster the DLL may lock, but a higher counting rate is required. The delay, Th, for a signal through the oscillator may be expressed as the product of the delay for each delay element, Tcoarse, and the quantity of delay elements in the oscillator, or Th=(M+½) *Tcoarse. Since the oscillator produces alternating inverted signals, the oscillator cycle or period, Tosc, includes two signals (e.g., an inverted signal and a non-inverted signal) that collectively traverse a quantity, Q, of delay elements twice that of a single signal (e.g., M+½), or Q=2*(M+½). Thus, the total delay or oscillator period, Tosc, may be expressed as the product of the coarse delay, Tcoarse, of each delay element and the quantity of delay elements, Q, or Tosc=Q*Tcoarse.

The cycle time detector determines the quantity of coarse delays, N, in a clock cycle which may be expressed as N=Tcycle/Tcoarse. Since the oscillator includes plural coarse delays instead of a single coarse delay, the quantity of coarse delays, N, is expressed in terms of the oscillator period, Tosc (e.g., Tosc=Q*Tcoarse). Multiplying the above expression for N by Q/Q or one, yields N=(Tcycle*Q)/ (Q*Tcoarse), where TON=Tcycle*Q and Tosc=Q*Tcoarse. Thus, the expression may be expressed in terms of the oscillator period, Tosc, where N=TON/Tosc. In other words, the quantity of delay elements, N, for a clock cycle may be determined by counting the number of oscillator periods during an interval TON (e.g., Q*Tcycle).

Frequency divider module 72 of cycle time detector 70 (FIG. 3) receives the internal clock signal (CLK2DLL) and divides the signal frequency by the quantity of delay elements traversed, Q. The frequency divider module may be implemented by any conventional or other devices or circuitry and produces a signal (TON) with a frequency proportional to the input signal frequency by a ratio of 1/Q. This essentially provides the output signal (TON) with a period of Q* the input signal frequency (e.g., or Q*Tcycle, since the input signal is the internal clock signal). This is illustrated by way of example in the timing diagrams of FIG. 5. The TON signal enables the oscillator, where the oscillator period or output pulses (OSCN) are coupled to controls of counter 50 via switch 80. The counter preferably ignores the initial rising edge of the oscillator output (e.g., to ensure counts of completed oscillator periods) and starts counting from the second rising edge (e.g., as viewed in FIG. 5) to ensure accuracy. However, other techniques may be employed to ensure a proper count (e.g., decrementing the final count, etc.). Since each oscillator output pulse represents an oscillator period, the quantity counted represents the quantity of oscillator periods (Tosc) within the interval TON, or TON/ Tosc. In other words, the resulting count represents N or the number of coarse delay elements within a clock period (e.g., since N=TON/Tosc).

In the case of an overflow condition detected by switch 80, the switch couples the oscillator output (OSCN) to decrement controls of counter 50, thereby decreasing the counter value for each oscillator period. This reduces the count by the number of delay elements, N, within a clock period and provides the DLL with a new locking position. In effect, this enables the DLL to lock in a preceding (e.g., K−1) clock. When an underflow condition is detected by switch 80, the switch couples the oscillator output (OSCN) to increment controls of counter 50, thereby increasing the counter value for each oscillator period. This increases the count by the number of delay elements, N, within a clock period and provides the DLL with a new locking position. In effect, this enables the DLL to lock in a succeeding (e.g., K+1) clock. During the overflow or underflow condition (e.g., during the interval TON), the delay of the delay line is fixed or frozen (e.g., based on the maximum or minimum count value), where no delay change is visible outside of the DLL. Once the quantity of delay elements, N, has been determined, the delay line adjustment occurs without occurrence of spikes since the difference between the adjusted and overflow or underflow count values (e.g., between zero and N for underflow, and between $2^P-1$ and $2^P-1-N$ for overflow) are spaced by a clock cycle. Depending upon the particular delay line, the adjustment of the count value is synchronized, and in the case of a delay line with multiple inputs, a single output or a differential structure, an error, Terr, introduced within the count as described below may be reduced to a maximum of one half of a coarse delay. In response to expiration of the TON interval, switch 80 couples the counter to phase detector 40 for operation as described above.

The determination of the quantity of delay elements, N, may introduce an error term and be expressed as:

$N=TON/Tosc+Terr$, where Terr represents the error term and is between zero and a coarse delay of delay line 20 (e.g., 0<Terr<one coarse delay). The error may be reduced by increasing the interval TON and maintaining the oscillator period, Tosc, fixed. For example, if TON was increased to a value, L*TON, the following expression results:

$L*TON/Tosc=L*N+L*Terr$ (where 0<Terr<one coarse delay).

Figure 5:
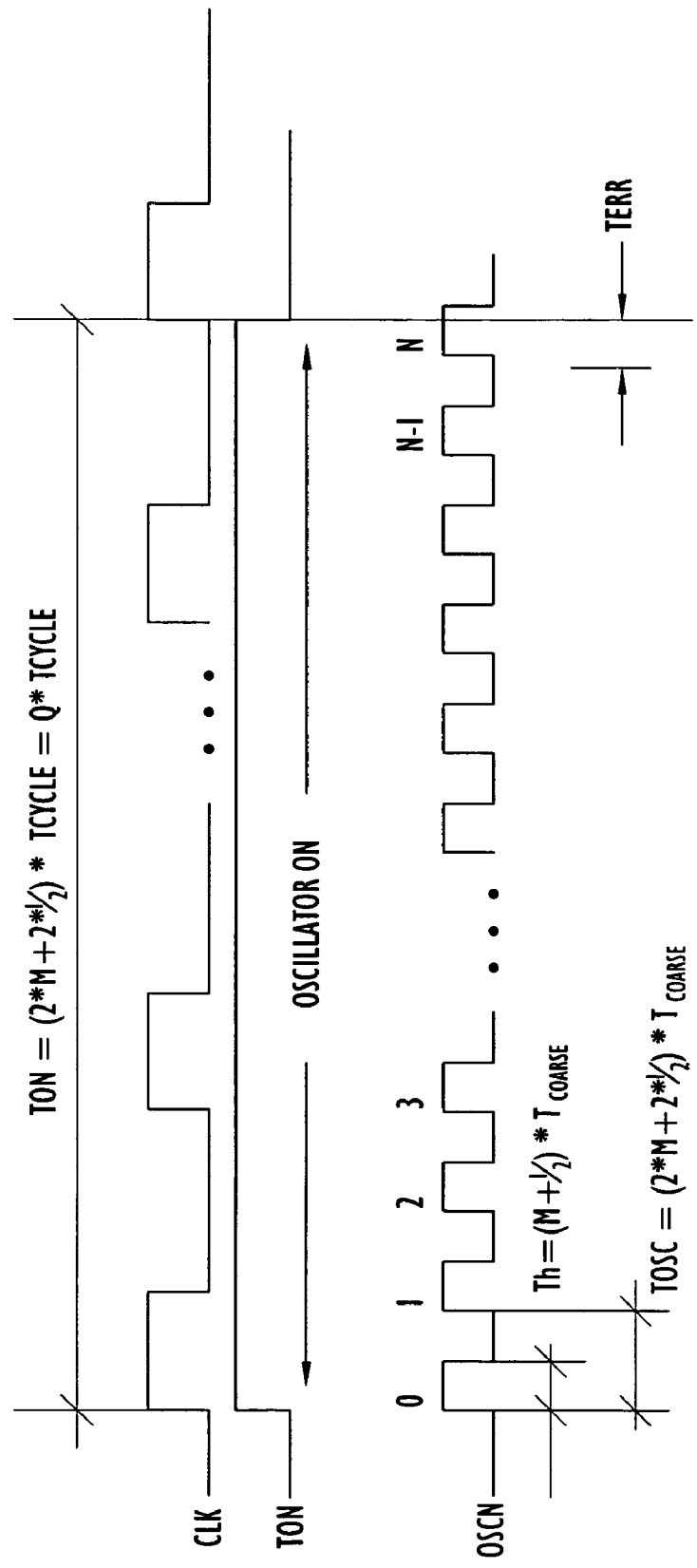
FIG. 5 is a graphical illustration of timing diagrams of the DLL of FIG. 3.

Since N represents a quantity of delay line coarse delays, the integer part of the term L*Terr represents a fraction of a coarse delay and may be indicated by the least significant bits of the counter (e.g., as viewed in FIG. 5). This portion of a coarse delay may be realized by blender unit 24 as described above. By way of example, if L=2, then L*Terr is the value of the least significant bit of the counter with the remaining bits representing the quantity of coarse delay elements, N. When L=4, L*Terr is the value of the two least significant bits of the counter with the remaining bits representing the quantity of coarse delay elements, N. The bits representing the portion of a coarse delay may be utilized to control blender unit 24 to provide the corresponding delay and enhance accuracy. Referring back to the above example with L=2, the oscillator is enabled for an interval twice as long as an interval for L=1, thereby producing a doubled value for the quantity, N. If the least significant bit of the counter is used to enable a portion (e.g., half) of the blender unit, the remaining bits of the count represent the number of coarse elements as described above. The interval, TON, may be further increased to achieve a desired resolution. However, the longer the TON interval or time for determining the quantity of delay elements, the slower the evaluation process.

Operation of the present invention DLL is described with reference to FIG. 3. Initially, the input receiver receives the external clock signal (CLK) and produces an internal clock signal (CLK2DLL) for transference to variable delay line 20 and phase detector 40. The internal clock signal includes an initial delay (T1) corresponding to the delay or amount of processing time utilized by the input receiver. The variable delay line delays the internal clock signal by an amount (T2) corresponding to a phase difference between the internal and feedback clock signals as described above. The resulting signal from the variable delay line (DCLK) is transferred to off-chip driver 30 and to feedback circuit 60. The driver further delays the signal by a delay or amount of processing time (δr) utilized by the driver and provides a clock signal (DQS) synchronized with the external clock signal (CLK) to other circuits.

The feedback circuit receives the signal (DCLK) from the variable delay line and includes delay elements producing a delay (Tf) corresponding to the delays of the input receiver (T1) and the driver (δr). Thus, the resulting feedback signal produced by the feedback circuit (FBCLK) simulates the delays (Tf=T1+δr) encountered by the external clock signal (CLK). The feedback signal (FBCLK) and internal clock signal (CLK2DLL) are received by phase detector 40 that determines the phase difference or skew between these signals, thereby indicating the phase difference between the internal and external clock signals (CLK and DQS).

The phase detector is coupled to switch 80 that detects overflow and underflow conditions and provides controls to counter 50 in accordance with detected conditions as described above. During the normal operating mode (e.g., in the absence of overflow or underflow conditions), switch 80 couples the phase detector output to counter 50 to indicate the phase difference between the signals received by the phase detector (CLK2DLL and FBCLK). The counter controls the delay (T2) provided by variable delay line 20 to compensate for the phase difference between the signals (CLK2DLL and FBCLK) and enable the resulting signal (DQS) to become synchronized with the external clock signal (CLK) as described above.

However, once the DLL is locked onto a clock frequency, systems may change the operating or clock frequency. The DLL operates during the frequency drift until the frequency change causes the counter to reach a maximum or minimum value, thereby respectively indicating overflow and underflow conditions as described above. When the DLL reaches an overflow or underflow condition, cycle time detector 70 is enabled and determines the quantity of coarse delay elements within a clock period. The output of the cycle time detector is coupled to switch 80 that enables the cycle time detector to control counter 50 during overflow and underflow conditions. The cycle time detector adjusts the count within the counter by the number of coarse delay elements within a clock period to enable locking within the preceding or succeeding clock period in accordance with detected overflow and underflow conditions, respectively. The count value provided to the delay line is maintained at the maximum or minimum value in response to overflow or underflow conditions to enable the count value to be adjusted without affecting the delay. After the count is adjusted, switch 80 couples the counter to phase detector 40 for operation as described above.

It will be appreciated that the embodiments described above and illustrated in the drawings represent only a few of the many ways of implementing a method and apparatus compensating for frequency drift in a delay locked loop.

The present invention DLL may accommodate any desired frequency range or clock or other signal period. The components (e.g., input receiver, variable delay line, off-chip driver, phase detector, counter, feedback circuit, switch, cycle time detector, etc.) of the present invention DLL may be implemented by any conventional or other devices or circuitry (e.g., logic, processors, software and/or hardware modules, gates, integrated circuits, etc.) performing the functions described herein and may be arranged in any fashion. The input receiver may be implemented by any conventional or other data receiver (e.g., buffer, gate, etc.). The driver may be implemented by any conventional or other devices (e.g., circuitry, etc.) to provide signals to other circuits. The phase detector may be implemented by any conventional or other devices (e.g., circuitry, processor, etc.) determining the phase difference between any quantity of signals in any desired resolution. The phase detector may provide the phase difference with respect to any types of units (e.g., the value of the phase difference, the quantity of delay elements or units for synchronization, etc.). The feedback circuit may be implemented by any conventional or other devices (e.g., circuitry, etc.) with any quantity of delay units each including any quantity of any types of delay elements (e.g., gates, inverters, buffers, etc.). The feedback circuit may provide any desired delay to simulate delays encountered by the external signal.

The variable delay line may be implemented by any conventional or other devices (e.g., circuitry, etc.) with any quantity of any types of delay units (e.g., coarse, fine or blender, etc.) each including any quantity of any types of delay elements (e.g., gates, inverters, buffers, etc.). The delay units may be arranged in any fashion and provide coarse and fine delays either individually or in any combinations. The coarse and fine delay units may provide any desired delays with any desired resolution. The variable delay line may receive any types of control signals to control the delays (e.g., count values, delay times, etc.). The variable delay line may be implemented without fine delays, thereby providing delays in coarse delay increments.

The counter may be implemented by any conventional or other counters (e.g., circuitry, processor, hardware and/or software counters, ALU, etc.) and may utilize any desired quantity of bits for the count value. The blender or fine delay of the present invention DLL may be controlled by any quantity of any of the bits of the count value (e.g., least significant bits, etc.), while the coarse delay of the present invention DLL may be controlled by any quantity of any of the bits of the count value (e.g., most significant bits, etc.). The counter of the present invention DLL may include any types of control inputs (e.g., increment, decrement, etc.) and may adjust the count in any manner based on any increment value.

The switch of the present invention DLL may be implemented by any conventional or other switching device (e.g., transfer gate, logic, processor, software and/or hardware modules, integrated circuit, etc.). The switch may detect overflow and overflow conditions based on any count values. The switch may couple the cycle time detector to any desired counter controls to adjust the count in any fashion.

The cycle time detector of the present invention DLL may determine the quantity of any types of delay elements (e.g., coarse, fine, etc.) for any desired clock period. The frequency divider module of the present invention DLL may be implemented by any conventional or other devices (e.g., circuitry, processor, splitter, divider, etc.) producing a signal having a frequency of any desired proportion in relation to the input signal frequency. The ring oscillator of the present invention DLL may be implemented by any conventional or other devices (e.g., circuitry, oscillators, etc.) with any quantity of delay units each including any quantity of any types of delay elements (e.g., NAND or other logic gates, inverters, buffers, etc.). The delay elements and units may be arranged in any fashion and produce any desired delays. The ring oscillator preferably has a correlation between the oscillator period and the delay elements of the DLL, but may provide or correspond to any desired delay. The ring oscillator may be enabled for any desired time interval (e.g., a multiple of the clock period, a portion of the clock period, etc.) sufficient to determine the quantity of delay elements in a clock period. The present invention DLL may determine the oscillator periods for any desired quantity of clock periods and adjust the count and delay accordingly (e.g., the DLL and variable delay line may be configured for any desired quantity of clock cycles or frequency ranges).

The counter preferably ignores the initial rising edge of the oscillator output (e.g., to ensure counts of completed oscillator periods) and starts counting from the second rising edge to ensure accuracy. However, any conventional or other techniques may be employed to ensure a proper count (e.g., including the initial edge and decrementing the final count, etc.). Further, the cycle time detector may be continuously enabled and control the counter based on the detection of overflow or underflow by the switching device. Alternatively, the cycle time detector may be enabled in response to detection of overflow or underflow conditions by the switching device. The cycle time detector, switching device and/or counter may employ any type of synchronization or enablement/disablement techniques (e.g., logic gates, handshaking, enable/disable lines, interrupts, etc.) to enable the quantity of oscillator periods to be determined during a complete TON cycle (e.g., to prevent the count from starting in an intermediate portion of a TON period, etc.) and to enable control of the counter (e.g., to enable the phase detector and cycle time detector to control the counter at appropriate times (e.g., in the absence of overflow/underflow conditions, at the completion of a TON cycle, etc.), to freeze the counter controls to the variable delay line during overflow/underflow conditions, etc.).

The signals may include any desired labels or references. The variables used herein (e.g., K, Q, M, etc.) are preferably integers, but may be any types of numbers (e.g., real, etc.).

The DLL of the present invention is not limited to the applications described above, but may be applied to digital or analog circuits and provide synchronization between any desired signals.

From the foregoing description, it will be appreciated that the invention makes available a novel method and apparatus compensating for frequency drift in a delay locked loop, wherein a DLL of the present invention adjusts the delay of a variable delay line by the quantity of delay elements in a clock period in order to accommodate overflow and underflow conditions without a DLL reset.

Having described preferred embodiments of a new and improved method and apparatus compensating for frequency drift in a delay locked loop, it is believed that other modifications, variations and changes will be suggested to those skilled in the art in view of the teachings set forth herein. It is therefore to be understood that all such variations, modifications and changes are believed to fall within the scope of the present invention as defined by the appended claims.

What is claimed is:

1. An apparatus to accommodate changes in frequency of an externally supplied input signal and to produce an output signal synchronized to said external signal comprising:
    a delay loop unit to determine and apply a delay to said external signal to produce said output signal in synchronization with said external signal, wherein said delay loop unit includes:
        a variable delay unit including at least one delay element to apply said determined delay to said external signal, wherein said variable delay unit is configured to provide delay within a delay range; and
        a switching device to detect occurrence of at least one condition producing a delay for said synchronization outside of said delay range and to selectively control adjustment of said determined delay; and
    a delay adjustment unit to determine a quantity of said delay elements collectively providing a delay corresponding to at least one period of said external signal and to adjust said determined delay in accordance with said delay element quantity in response to occurrence of at least one of said conditions.

2. The apparatus of claim 1, further including:
    a receiver to receive said external signal; and
    a driver to receive said delayed signal from said variable delay unit and produce said output signal;
    wherein said delay loop unit further includes:
        a feedback unit to apply a feedback delay to said delayed signal from said variable delay unit to produce a feedback signal, wherein said feedback delay corresponds to at least one delay encountered by said external signal;
        a phase detector coupled to said receiver and said feedback unit to determine a phase value associated with a phase difference between said external and output signals; and
        a counter to produce a count to control said delay applied by said variable delay unit;
        wherein said switching device couples said phase detector to said counter to control said delay applied by said variable delay unit based on said phase difference in the absence of said conditions, and wherein said switching device couples said delay adjustment unit to said counter to adjust said count and corresponding delay applied by said variable delay unit in response to the presence of at least one of said conditions.

3. The apparatus of claim 2, wherein said at least one condition includes an overflow condition enabling said delay to attain a value beyond a maximum value of said delay range.

4. The apparatus of claim 3, wherein said switching device detects occurrence of said overflow condition based on said count attaining a maximum counter value.

5. The apparatus of claim 3, wherein said delay adjustment unit reduces said count by said quantity of delay elements in response to said overflow condition to enable said output signal to be synchronized with said external signal within an earlier period of said external signal.

6. The apparatus of claim 2, wherein said at least one condition includes an underflow condition enabling said delay to attain a value less than a minimum value of said delay range.

7. The apparatus of claim 6, wherein said switching device detects occurrence of said underflow condition based on said count attaining a minimum counter value.

8. The apparatus of claim 6, wherein said delay adjustment unit increases said count by said quantity of delay elements in response to said underflow condition to enable said output signal to be synchronized with said external signal within a later period of said external signal.

9. The apparatus of claim 1, wherein said delay adjustment unit includes:
   a frequency divider module to produce an enable signal; and
   an oscillator responsive to said enable signal and including a plurality of delay units with delays correlated with said delay elements of said variable delay unit, wherein an amount of oscillator periods within a period of said enable signal corresponds to said delay element quantity and said oscillator is coupled to said switching device to adjust said determined delay by a delay corresponding to said oscillator period amount.

10. The apparatus of claim 9, wherein said oscillator includes a ring oscillator.

11. The apparatus of claim 2, wherein said variable delay unit includes:
   a coarse delay unit including at least one coarse delay element each producing a delay of a first magnitude;
   wherein said delay adjustment unit determines a quantity of said coarse delay elements collectively providing a delay corresponding to said external signal period to adjust said determined delay based on said coarse delay element quantity in response to occurrence of at least one of said conditions.

12. The apparatus of claim 11, wherein said counter represents said count with a plurality of bits and said variable delay unit further includes:
   a blender unit producing a delay of a second magnitude less than said first magnitude;
   wherein said determined quantity of coarse delay elements includes an error term representing a portion of a coarse delay and indicated within said count by a portion of said plurality of bits, and wherein said portion of said count bits controls said blender unit and a remaining portion of said count bits controls said coarse delay unit to apply said delay from said variable delay unit.

13. The apparatus of claim 1, wherein said delay loop unit includes a delay locked loop.

14. The apparatus of claim 1, wherein said external signal includes a clock signal.

15. A method of accommodating changes in frequency of an externally supplied input signal and producing an output signal synchronized to said external signal comprising:
   (a) determining a delay for a variable delay unit to apply to said external signal to produce said output signal in synchronization with said external signal, wherein said variable delay unit includes at least one delay element and is configured to provide delay within a delay range;
   (b) detecting occurrence of at least one condition producing a delay for said synchronization outside of said delay range;
   (c) selectively controlling adjustment of said determined delay in accordance with detected conditions;
   (d) determining a quantity of said delay elements collectively providing a delay corresponding to at least one period of said external signal and adjusting said determined delay in accordance with said delay element quantity in response to occurrence of at least one of said conditions; and
   (e) applying delay to said external signal in accordance with detected conditions.

16. The method of claim 15, wherein step (a) further includes:
   (a.1) receiving said external signal;
   (a.2) applying a feedback delay to said delayed signal from said variable delay unit to produce a feedback signal, wherein said feedback delay corresponds to at least one delay encountered by said external signal;
   (a.3) determining a phase value from said received and feedback signals, wherein said phase value is associated with a phase difference between said external and output signals; and
   (a.4) producing a count to control said delay applied by said variable delay unit;
   wherein step (c) further includes:
   (c.1) controlling said delay applied by said variable delay unit based on said phase difference in the absence of said conditions;
   step (d) further includes:
   (d.1) adjusting said count and corresponding delay applied by said variable delay unit in response to the presence of at least one of said conditions;
   and step (e) further includes:
   (e.1) receiving said delayed signal from said variable delay unit and producing said output signal.

17. The method of claim 16, wherein said at least one condition includes an overflow condition enabling said delay to attain a value beyond a maximum value of said delay range.

18. The method of claim 17, wherein step (b) further includes:
   (b.1) detecting occurrence of said overflow condition based on said count attaining a maximum value.

19. The method of claim 17, wherein step (d.1) further includes:
   (d.1.1) reducing said count by said quantity of delay elements in response to said overflow condition to enable said output signal to be synchronized with said external signal within an earlier period of said external signal.

20. The method of claim 16, wherein said at least one condition includes an underflow condition enabling said delay to attain a value less than a minimum value of said delay range.

21. The method of claim 20, wherein step (b) further includes:
   (b.1) detecting occurrence of said underflow condition based on said count attaining a minimum value.

22. The method of claim 20, wherein step (d.1) further includes:
   (d.1.1) increasing said count by said quantity of delay elements in response to said underflow condition to enable said output signal to be synchronized with said external signal within a later period of said external signal.

23. The method of claim 15, wherein step (d) further includes:
(d.1) producing an enable signal; and
(d.2) enabling an oscillator with said enable signal, wherein said oscillator includes a plurality of delay units with delays correlated with said delay elements of said variable delay unit, and wherein an amount of oscillator periods within a period of said enable signal corresponds to said delay element quantity and said oscillator adjusts said determined delay by a delay corresponding to said oscillator period amount.

24. The method of claim 16, wherein said variable delay unit includes a coarse delay unit including at least one coarse delay element each producing a delay of a first magnitude, and step (d.1) further includes:
(d.1.1) determining a quantity of said coarse delay elements collectively providing a delay corresponding to said external signal period to adjust said determined delay based on said coarse delay element quantity in response to occurrence of at least one of said conditions.

25. The method of claim 24, wherein said variable delay unit further includes a blender unit producing a delay of a second magnitude less than said first magnitude, said count is represented by a plurality of bits and said determined quantity of coarse delay elements includes an error term representing a portion of a coarse delay and indicated within said count by a portion of said plurality of bits, and wherein step (d.1) further includes:
(d.1.2) controlling said blender unit via said portion of said count bits and controlling said coarse delay unit via a remaining portion of said count bits to apply said delay from said variable delay unit.

26. The method of claim 15, wherein said external signal includes a clock signal.

27. An apparatus to accommodate changes in frequency of an externally supplied input signal and to produce an output signal synchronized to said external signal comprising:
delay loop means for determining and applying a delay to said external signal to produce said output signal in synchronization with said external signal, wherein said delay loop means includes:
variable delay means including at least one delay element for applying said determined delay to said external signal, wherein said variable delay means is configured to provide delay within a delay range; and
switching means for detecting occurrence of at least one condition producing a delay for said synchronization outside of said delay range and for selectively controlling adjustment of said determined delay; and
delay adjustment means for determining a quantity of said delay elements collectively providing a delay corresponding to at least one period of said external signal and to adjust said determined delay in accordance with said delay element quantity in response to occurrence of at least one of said conditions.

28. The apparatus of claim 27, further including:
receiving means for receiving said external signal; and
driver means for receiving said delayed signal from said variable delay means and producing said output signal;
wherein said delay loop means further includes:
feedback means for applying a feedback delay to said delayed signal from said variable delay means to produce a feedback signal, wherein said feedback delay corresponds to at least one delay encountered by said external signal;
phase detecting means coupled to said receiving means and said feedback means for determining a phase value associated with a phase difference between said external and output signals; and
counting means for producing a count to control said delay applied by said variable delay means;
wherein said switching means couples said phase detecting means to said counting means to control said delay applied by said variable delay means based on said phase difference in the absence of said conditions, and wherein said switching means couples said delay adjustment means to said counting means to adjust said count and corresponding delay applied by said variable delay means in response to the presence of at least one of said conditions.

29. The apparatus of claim 28, wherein said at least one condition includes an overflow condition enabling said delay to attain a value beyond a maximum value of said delay range.

30. The apparatus of claim 29, wherein said switching means detects occurrence of said overflow condition based on said count attaining a maximum counting means value.

31. The apparatus of claim 29, wherein said delay adjustment means reduces said count by said quantity of delay elements in response to said overflow condition to enable said output signal to be synchronized with said external signal within an earlier period of said external signal.

32. The apparatus of claim 28, wherein said at least one condition includes an underflow condition enabling said delay to attain a value less than a minimum value of said delay range.

33. The apparatus of claim 32, wherein said switching means detects occurrence of said underflow condition based on said count attaining a minimum counting means value.

34. The apparatus of claim 32, wherein said delay adjustment means increases said count by said quantity of delay elements in response to said underflow condition to enable said output signal to be synchronized with said external signal within a later period of said external signal.

35. The apparatus of claim 27, wherein said delay adjustment means includes:
frequency dividing means for producing an enable signal; and
oscillating means responsive to said enable signal and including a plurality of delay units with delays correlated with said delay elements of said variable delay means, wherein an amount of periods of said oscillating means within a period of said enable signal corresponds to said delay element quantity and said oscillating means is coupled to said switching means for adjusting said determined delay by a delay corresponding to said amount of oscillating means periods.

36. The apparatus of claim 35, wherein said oscillating means includes a ring oscillator.

37. The apparatus of claim 28, wherein said variable delay means includes:
coarse delay means including at least one coarse delay element each producing a delay of a first magnitude;
wherein said delay adjustment means determines a quantity of said coarse delay elements collectively providing a delay corresponding to said external signal period to adjust said determined delay based on said coarse delay element quantity in response to occurrence of at least one of said conditions.

38. The apparatus of claim 37, wherein said counting means represents said count with a plurality of bits and said variable delay means further includes:
   blender means for producing a delay of a second magnitude less than said first magnitude;
   wherein said determined quantity of coarse delay elements includes an error term representing a portion of a coarse delay and indicated within said count by a portion of said plurality of bits, and wherein said portion of said count bits controls said blender means and a remaining portion of said count bits controls said coarse delay means to apply said delay from said variable delay means.

39. The apparatus of claim 27, wherein said delay loop means includes a delay locked loop.

40. The apparatus of claim 27, wherein said external signal includes a clock signal.

* * * * *